(12) United States Patent
Trefonas et al.

(10) Patent No.: US 8,822,615 B1
(45) Date of Patent: *Sep. 2, 2014

(54) BLOCK COPOLYMER COMPOSITION AND METHODS RELATING THERETO

(71) Applicant: Rohm and Haas Electronic Materials LLC, Marlborough, MA (US)

(72) Inventors: Peter Trefonas, Medway, MA (US); Phillip Hustad, Manvel, TX (US); Xinyu Gu, Lake Jackson, TX (US); Erin Vogel, Midland, MI (US); Valeriy Ginzburg, Midland, MI (US); Shih-Wei Chang, Natick, MA (US); Daniel Murray, Midland, MI (US)

(73) Assignees: Rohm and Haas Electronic Materials LLC, Marlborough, MA (US); Dow Global Technologies LLC, Midland, MI (US)

( * ) Notice: Subject to any disclaimer, the term of this patent is extended or adjusted under 35 U.S.C. 154(b) by 77 days.

This patent is subject to a terminal disclaimer.

(21) Appl. No.: 13/762,749

(22) Filed: Feb. 8, 2013

(51) Int. Cl.
*C08F 30/08* (2006.01)
*C08F 20/06* (2006.01)
*C08F 118/02* (2006.01)
*C09D 153/00* (2006.01)

(52) U.S. Cl.
CPC .................................. *C09D 153/00* (2013.01)
USPC ......................... 526/279; 526/317.1; 526/319

(58) Field of Classification Search
CPC .... C08F 293/005; C08L 53/00; C09D 133/10
USPC ....................................... 526/279, 317.1, 319
See application file for complete search history.

(56) References Cited

U.S. PATENT DOCUMENTS

| | | | |
|---|---|---|---|
| 6,458,878 | B1 | 10/2002 | Tsuboi et al. |
| 7,560,141 | B1 | 7/2009 | Kim et al. |
| 8,043,520 | B2 | 10/2011 | Asakawa et al. |
| 2005/0113475 | A1 | 5/2005 | Nishida et al. |
| 2007/0254169 | A1 | 11/2007 | Kamins et al. |
| 2010/0075116 | A1 | 3/2010 | Russell et al. |
| 2011/0059299 | A1 | 3/2011 | Kim et al. |
| 2011/0257289 | A1* | 10/2011 | Biggs et al. ................... 523/102 |
| 2012/0046415 | A1 | 2/2012 | Millward et al. |

OTHER PUBLICATIONS

Takenaka, et al, Formation of long-range stripe patterns with sub-10-nm half-pitch from directed self-assembly of block copolymer, Journal of Polymer Science: Part B, Polymer Physics, vol. 48, pp. 2297 2301 (2010).
Stadermann, et al., Functionalized Block Copolymers for Preparation of Reactive Self-Assembled Surface Patterns, Journal of Polymer Science Part A: Polymer Chemistry, published online (2011).
Ahn, et al., Temperature-dependent phase behaviors in cylinder-forming block copolymers, International Journal of Molecular Science, vol. 10, Issue 5, pp. 2169-2189 (2009).
Ahn, et al., Fabrication of well-defined block copolymer nano-cylinders by controlling the thermodynamics and kinetics involved in block copolymer self-assembly, Soft Matter, The Royal Society of Chemistry, vol. 4, pp. 1454-1466 (2008).
Copending U.S. Appl. No. 13/370,588.
Copending U.S. Appl. No. 13/370,606.
Copending U.S. Appl. No. 13/762,772.
Copending U.S. Appl. No. 13/762,973.

* cited by examiner

*Primary Examiner* — William Cheung
(74) *Attorney, Agent, or Firm* — Thomas S. Deibert

(57) ABSTRACT

A copolymer composition is provided including a block copolymer having a poly(acrylate) block and a poly(silyl acrylate) block; wherein the block copolymer exhibits a number average molecular weight, $M_N$, of 1 to 1,000 kg/mol; and, wherein the block copolymer exhibits a polydispersity, PD, of 1 to 2. Also provided are substrates treated with the copolymer composition.

12 Claims, No Drawings

BLOCK COPOLYMER COMPOSITION AND METHODS RELATING THERETO

The present invention relates to the field of self assembling block copolymers. In particular, the present invention is directed to a specific copolymer composition including a block copolymer having a poly(acrylate) block and a poly (silyl acrylate) block.

Some block copolymers, consisting of two or more distinct homopolymers joined end to end, are known self-assemble into periodic micro domains having typical dimensions of 10 nanometers to 50 nanometers (nm). The possibility of using such micro domains to pattern surfaces has attracted increasing interest because of the expense and difficulty of patterning in nanoscale dimensions (especially sub-45 nm) using optical lithography.

Controlling the lateral placement of the block copolymer micro domains on the substrates continues to be a challenge, however. This problem has been previously addressed using lithographically predefined topographic and/or chemical patterning of the substrate. Previous studies have demonstrated that self assembled block copolymer micro domains in form of lamellae can be directed to follow chemical patterning of the substrate, yielding periodicities close to those of the chemical prepatterns. Other studies have shown that by controlling the surface wetting properties of the block copolymer on the bottom and side walls of a topographic prepattern, the lamellae can be directed to follow the topographic prepattern. The lamellae formed line/space patterns of smaller dimensions than the substrate prepattern, subdividing the topographic prepattern into a higher frequency line pattern; that is, a line pattern having a smaller pitch. One limitation of block copolymer patterning is the propensity of the patterns to form everywhere on the pre-pattern surface, for topographic and/or chemical guiding prepatterns.

The ability to shrink the size of various features on a given substrate (e.g., gates in field effect transistors) is currently limited by the wavelength of light used to expose photoresists (i.e., 193 nm). These limitations create a significant challenge for the fabrication of features having a critical dimension (CD) of <50 nm. The use of conventional block copolymers present difficulties in orientation control and long range ordering during the self assembly process. Moreover, such block copolymers frequently provide inadequate etch resistance for subsequent processing steps.

Takenaka, et al.[1] investigated the use of diblock copolymer for directed self assembly. Specifically, Takenaka, et al. demonstrated the directed self assembly down to sub 10 nm half pitch using a poly(styrene)-b-poly(dimethyl siloxane) diblock copolymer with a molecular weight of 15.8 kg/mol; a heterogeneity index of 1.03; and, a poly(styrene) volume fraction of 0.74 poly(styrene); wherein the diblock copolymer film was annealed in vacuum at 170° C. for 24 hours.

[1]Takenaka, et al, *Formation of long-range stripe patterns with sub-10-nm half-pitch from directed self-assembly of block copolymer*, JOURNAL OF POLYMER SCIENCE: PART B, Polymer Physics, vol. 48, pp. 2297-2301 (2010).

Notwithstanding, there remains a need for new copolymer compositions for use in patterning substrates. In particular, there remains a need for new copolymer compositions that enable patterning on intermediate length scales (e.g., 20 to 40 nm) and that preferably exhibit a fast annealing profile with low defect formation.

The present invention provides a copolymer composition, comprising: a block copolymer having a poly(acrylate) block and a poly(silyl acrylate) block; and, an antioxidant; wherein the block copolymer exhibits a number average molecular weight, $M_N$, of 1 to 1,000 kg/mol; wherein the copolymer composition contains ≥2 wt % antioxidant (based on the weight of the block copolymer); and, wherein the block copolymer exhibits a polydispersity, PD, of 1 to 2.

The present invention provides a method comprising: providing a substrate; providing a copolymer composition of the present invention; applying a film of the copolymer composition to the substrate; optionally, baking the film; annealing the film, leaving a pattern of poly(acrylate) domains and poly(silyl acrylate) domains; treating the annealed film to remove the poly(acrylate) domains from the annealed film and to convert the poly(silyl acrylate) domains in the annealed film to $SiO_x$.

The present invention provides a copolymer composition, comprising: a block copolymer having a poly(acrylate) block and a poly(silyl acrylate) block; wherein the block copolymer exhibits a number average molecular weight, $M_N$, of 1 to 1,000 kg/mol; wherein the block copolymer exhibits a polydispersity, PD, of 1 to 2; and, wherein the block copolymer contains ≤75 wt % of a poly(methyl methacrylate)-block-poly((trimethylsilyl)methyl methacrylate) diblock copolymer.

The present invention provides a copolymer composition, comprising: a block copolymer having a poly(acrylate) block and a poly(silyl acrylate) block; wherein the block copolymer exhibits a number average molecular weight, $M_N$, of 1 to 1,000 kg/mol; wherein the block copolymer exhibits a polydispersity, PD, of 1 to 2; and, wherein the block copolymer contains ≤0.001 wt % of a poly(methyl methacrylate)-block-poly((trimethylsilyl)methyl methacrylate) diblock copolymer.

DETAILED DESCRIPTION

When applied to the surface of a substrate, the copolymer composition of the present invention exhibits an improved capability to anneal at a given processing temperature to a low defect structure compared to that obtained using a conventional silicon containing polymers, such as PS-b-PDMS. Moreover, the incorporation of an inorganic moiety in the poly(silyl acrylate) domain of the copolymer composition of the present invention is convertible to an etch resistant species (e.g., a mask) upon processing of the deposited copolymer composition to remove the organic components. The copolymer composition of the present invention provides significant value for enabling thermal processing in directed self assembly applications used to form periodic nanostructures, such as line/space patterns on silicon containing substrates, in, for example, the 20-40 nm range.

The term "PAcr-b-PSiAcr block copolymer" used herein and in the appended claims is short hand for a poly(acrylate)-block-poly(silyl acrylate); wherein the poly(acrylate) block includes residues from at least one of an acrylate monomer, a deuterated acrylate monomer, an acrylate block modifying monomer and a deuterated acrylate block modifying monomer; and, wherein the poly(silyl acrylate) block includes residues from at least one of a silyl acrylate monomer, a deuterated silyl acrylate monomer, a silyl acrylate block modifying monomer and a deuterated silyl acrylate block modifying monomer.

The term "deuterated acrylate monomer" used herein and in the appended claims is an acrylate monomer in which at least one hydrogen has been replaced with deuterium.

The term "deuterated acrylate block modifying monomer" used herein and in the appended claims is an acrylate modifying monomer in which at least one hydrogen has been replaced with deuterium.

The term "deuterated silyl acrylate monomer" used herein and in the appended claims is a silyl acrylate monomer in which at least one hydrogen has been replaced with deuterium.

The term "deuterated silyl acrylate block modifying monomer" used herein and in the appended claims is a silyl acrylate modifying monomer in which at least one hydrogen has been replaced with deuterium.

The terms "(trimethylsilyl)methyl methacrylate" and "TMSMMA" used herein and in the appended claims refers to a monomer having the following molecular structure:

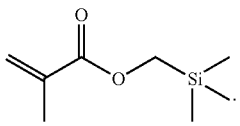

The term "$M_{N\text{-}BCP}$" used herein and in the appended claims in reference to a block copolymer of the present invention is the number average molecular weight of the block copolymer determined according to the method used herein in the Examples.

The term "$M_{W\text{-}BCP}$" used herein and in the appended claims in reference to a block copolymer of the present invention is the weight average molecular weight of the block copolymer determined according to the method used herein in the Examples.

The term "$PD_{BCP}$" used herein and in the appended claims in reference to a block copolymer of the present invention is the polydispersity of the block copolymer determined according to the following equation:

$$PD_{BCP} = \frac{M_{W-BCP}}{M_{N-BCP}}.$$

The term "$Wf_{PAcr}$" used herein and in the appended claims in reference to a block copolymer of the present invention is the weight percent of the poly(acrylate) block in the block copolymer.

The term "$Wf_{PSiAcr}$" used herein and in the appended claims in reference to a block copolymer of the present invention is the weight percent of the poly(silyl acrylate) block in the block copolymer.

Block copolymers are polymers that are synthesized from two or more different monomers and exhibit two or more polymeric chain segments that are chemically different, but yet, are covalently bound to one another. Diblock copolymers are a special class of block copolymers derived from two different monomers (e.g., A and B) and having a structure comprising a polymeric block of A residues covalently bound to a polymeric block of B residues (e.g., AAAAA-BBBBB).

The block copolymer used in the copolymer composition of the present invention include block copolymers having at least two different blocks; wherein one of the blocks is a poly(acrylate) block and one of the blocks is a poly(silyl acrylate) block. The block copolymers used in the copolymer composition of the present invention optionally contain one or more other blocks (e.g., a triblock copolymer).

Preferably, the block copolymer used in the copolymer composition of the present invention is a PAcr-b-PSiAcr diblock copolymer comprising domains of poly(acrylate) block and poly(silyl acrylate) block; wherein the block copolymer exhibits a film pitch, $L_0$, of 10 to 100 nm (preferably 14 to 60 nm; most preferably 20 to 40 nm) when deposited on a substrate under the conditions set forth herein in the Examples.

Preferably, the block copolymer used in the copolymer composition of the present invention is a PAcr-b-PSiAcr diblock copolymer comprising domains of poly(acrylate) and poly(silyl acrylate); wherein the block copolymer exhibits a number average molecular weight, $M_{N\text{-}BCP}$, of 1 to 1,000 kg/mol (preferably 10 to 500 kg/mol; more preferably 15 to 300 kg/mol; still more preferably 15 to 100 kg/mol; most preferably 20 to 60 kg/mol); and, wherein the block copolymer exhibits a polydispersity, $PD_{BCP}$, of 1 to 3 (preferably 1 to 2; most preferably 1 to 1.2).

Preferably, the block copolymer used in the copolymer composition of the present invention is a PAcr-b-PSiAcr diblock copolymer comprising domains of poly(acrylate) and poly(silyl acrylate); wherein the diblock copolymer has a poly(acrylate) weight fraction, $Wf_{PAcr}$, of 0.69 to 0.83 (preferably 0.69 to 0.80; most preferably 0.70 to 0.75); and wherein the diblock copolymer has a number average molecular weight, $M_N$, of 10 to 1,000 kg/mol (preferably 15 to 200 kg/mol; more preferably 15 to 100 kg/mol; most preferably 20 to 60 kg/mol). Diblock copolymers of the present invention having a $Wf_{PAcr}$ of 0.69 to 0.83 and a number average molecular weight, $M_N$, of 10 to 1,000 kg/mol tend to exhibit cylindrical poly(silyl acrylate) domains that microphase separate from the poly(acrylate) domains. Given the teachings provided herein, one of ordinary skill in the art will be able to deposit a copolymer composition of the present invention containing such PAcr-b-PSiAcr diblock copolymers, wherein cylindrical poly(silyl acrylate) domains in the deposited copolymer composition will self assemble to orient themselves with their axes of symmetry parallel to the surface of the substrate, perpendicular to the surface of the substrate or a combination of parallel and perpendicular to the surface of the substrate, through the selection and control of the film deposition conditions, for example: (a) the substrate's surface energy (i.e., by pretreating the surface of the substrate with an interposing material), (b) the thickness of the film of copolymer composition deposited, (c) the bake profile of the deposited copolymer composition (i.e., bake temperature and bake time) and (d) the anneal profile of the deposited copolymer composition (i.e., anneal temperature and anneal time).

Preferably, the block copolymer of the present invention is a PAcr-b-PSiAcr diblock copolymer comprising domains of poly(acrylate) and poly(silyl acrylate); wherein the diblock copolymer has a poly(acrylate) weight fraction, $Wf_{PAcr}$, of 0.39 to <0.69 (preferably 0.44 to 0.64; most preferably 0.49 to 0.59); and wherein the diblock copolymer has a number average molecular weight, $M_N$, of 10 to 1,000 kg/mol (preferably 15 to 200 kg/mol; more preferably 15 to 100 kg/mol; most preferably 20 to 60 kg/mol). Diblock copolymers of the present invention having a $Wf_{PAcr}$ of 0.39 to <0.69 and a number average molecular weight, $M_N$, of 10 to 1,000 kg/mol tend to exhibit microphase separated poly(acrylate) and poly(silyl acrylate) lamellar domains. Given the teachings provided herein, one of ordinary skill in the art will be able to deposit a copolymer composition of the present invention containing such PAcr-b-PSiAcr diblock copolymers, wherein lamellar domains in the deposited copolymer composition will self assemble to orient themselves with their axes of symmetry parallel to the surface of the substrate, perpendicular to the surface of the substrate or a combination of parallel and perpendicular to the surface of the substrate, through the selection and control of the film deposition conditions, for example: (a) the substrate's surface energy (i.e., by pretreating the surface of the substrate with an interposing material), (b) the thickness of the film of copolymer composition deposited, (c) the bake profile of the deposited copolymer composition (i.e., bake temperature and bake time) and (d) the anneal profile of the deposited copolymer composition (i.e., anneal temperature and anneal time).

Preferably, the block copolymer used in the copolymer composition of the present invention is a PAcr-b-PSiAcr diblock copolymer comprising domains of poly(acrylate) and poly(silyl acrylate); wherein the diblock copolymer has a poly(acrylate) weight fraction, $Wf_{PAcr}$, of 0.23 to <0.39 (preferably 0.26 to 0.34; most preferably 0.27 to 0.30); and wherein the diblock copolymer has a number average molecular weight, $M_N$, of 10 to 1,000 kg/mol (preferably 15 to 200 kg/mol; more preferably 15 to 100 kg/mol; most preferably 20 to 60 kg/mol). Diblock copolymers of the present invention having a $Wf_{PAcr}$ of 0.23 to <0.39 and a number average molecular weight, $M_N$, of 10 to 1,000 kg/mol tend to exhibit cylindrical poly(acrylate) domains that microphase separate from the poly(silyl acrylate). Given the teachings provided herein, one of ordinary skill in the art will be able to deposit a copolymer composition of the present invention containing such PAcr-b-PSiAcr diblock copolymers, wherein cylindrical poly(acrylate) domains in the deposited copolymer composition will self assemble to orient themselves with their axes of symmetry parallel to the surface of the substrate, perpendicular to the surface of the substrate or a combination of parallel and perpendicular to the surface of the substrate, through the selection and control of the film deposition conditions, for example: (a) the substrate's surface energy (i.e., by pretreating the surface of the substrate with an interposing material), (b) the thickness of the film of copolymer composition deposited, (c) the bake profile of the deposited copolymer composition (i.e., bake temperature and bake time) and (d) the anneal profile of the deposited copolymer composition (i.e., anneal temperature and anneal time).

Preferably, the poly(acrylate)-b-poly(silyl acrylate) block copolymers have a poly(acrylate) block; wherein the poly (acrylate) block includes residues from at least one of an acrylate monomer, a deuterated acrylate monomer, an acrylate block modifying monomer and a deuterated acrylate block modifying monomer; and, wherein the poly(acrylate) block includes >75 wt % (more preferably, >90 wt %; most preferably, >95 wt %) of acrylate monomer derived units.

Preferably, the acrylate monomer is selected from the group consisting of aryl (alkyl)acrylate (e.g., phenyl acrylate, phenyl methacrylate); alkyl (alkyl)acrylate (e.g., methyl acrylate, methyl methacrylate); halogenated aryl (alkyl)acrylate (e.g., chlorophenyl acrylate, chlorophenyl methacrylate); halogenated alkyl (alkyl)acrylate (e.g., fluoropropyl acrylate, fluoropropyl methacrylate) and, combinations thereof. More preferably, the acrylate monomer is selected from the group consisting of $C_{6-14}$ aryl ($C_{1-5}$ alkyl)acrylate; $C_{1-5}$ alkyl ($C_{1-5}$ alkyl)acrylate. Still more preferably, the acrylate monomer is selected from the group consisting of butyl (meth)acrylate, propyl (meth)acrylate), ethyl (meth)acrylate, methyl (meth) acrylate. Most preferably, the acrylate monomer is methyl methacrylate.

Preferably, the deuterated acrylate monomer is selected from the group consisting of deuterated aryl (alkyl)acrylate (e.g., deuterated phenyl acrylate, deuterated phenyl methacrylate); deuterated alkyl (alkyl)acrylate (e.g., deuterated methyl acrylate, deuterated methyl methacrylate); deuterated halogenated aryl (alkyl)acrylate (e.g., deuterated chlorophenyl acrylate, deuterated chlorophenyl methacrylate); deuterated halogenated alkyl (alkyl)acrylate (e.g., deuterated fluoropropyl acrylate, deuterated fluoropropyl methacrylate) and, combinations thereof. More preferably, the deuterated acrylate monomer is selected from the group consisting of deuterated $C_{6-14}$ aryl ($C_{1-5}$ alkyl)acrylate; deuterated $C_{1-5}$ alkyl ($C_{1-5}$ alkyl)acrylate. Still more preferably, the deuterated acrylate monomer is selected from the group consisting of deuterated butyl (meth)acrylate, deuterated propyl (meth) acrylate), deuterated ethyl (meth)acrylate, deuterated methyl (meth)acrylate. Most preferably, the deuterated acrylate monomer is deuterated methyl methacrylate.

Preferably, the acrylate block modifying monomer is selected from the group consisting of an alkene and a cycloalkene. More preferably, the acrylate block modifying monomer is selected from a $C_{1-5}$ alkene and a $C_{3-7}$ cycloalkene. Most preferably, the acrylate block modifying monomer is ethylene.

Preferably, the deuterated acrylate block modifying monomer is selected from the group consisting of a deuterated alkene and a deuterated cycloalkene. More preferably, the deuterated acrylate block modifying monomer is selected from a deuterated $C_{1-5}$ alkene and deuterated a $C_{3-7}$ cycloalkene. Most preferably, the deuterated acrylate block modifying monomer is deuterated ethylene.

Preferably, the poly(acrylate)-b-poly(silyl acrylate) block copolymers have a poly(silyl acrylate) block; wherein the poly(silyl acrylate) block includes residues from at least one of a silyl acrylate monomer, a deuterated silyl acrylate monomer, a silyl acrylate block modifying monomer and a deuterated silyl acrylate block modifying monomer; and, wherein the poly(silyl acrylate) block includes >75 wt % (more preferably, >90 wt %; most preferably, >95 wt %) of silyl acrylate monomer derived units.

Preferably, the silyl acrylate monomer is according to the following formula

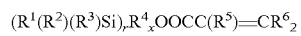

$(R^1(R^2)(R^3)Si)_rR^4_xOOCC(R^5)=CR^6_2$ wherein each $R^1$, $R^2$ and $R^3$ is independently selected from the group consisting of a $C_{1-18}$ alkyl group, a halogenated $C_{1-18}$ alkyl group, a silylated $C_{1-18}$ alkyl group, a silylated halogenated $C_{1-18}$ alkyl group, an oxy $C_{1-18}$ alkyl group, an oxy silylated $C_{1-18}$ alkyl group, an oxy silylated halogenated $C_{1-18}$ alkyl group, a $C_{6-14}$ aryl group, a halogenated $C_{6-14}$ aryl group, an oxy $C_{6-14}$ aryl group, a silylated $C_{6-14}$ aryl group, an oxy silylated $C_{6-14}$ aryl group, an oxy silylated halogenated $C_{6-14}$ aryl group, a $C_{1-18}$ arylalkyl group, a halogenated $C_{1-18}$ arylalkyl group, an oxy $C_{1-18}$ arylalkyl group, a silylated $C_{1-18}$ arylalkyl group, a silylated halogenated $C_{1-18}$ arylalkyl group, an oxy silylated $C_{1-18}$ arylalkyl group, an oxy silylated halogenated $C_{1-18}$ arylalkyl group, a $C_{6-14}$ alkylaryl group, a halogenated $C_{6-14}$ alkylaryl group, an oxy $C_{6-14}$ alkylaryl group, a silylated $C_{6-14}$ alkylaryl group, an oxy silylated $C_{6-14}$ alkylaryl group and an oxy silylated halogenated $C_{6-14}$ alkylaryl group (preferably, a $C_{1-6}$ alkyl group, a silylated $C_{1-6}$ alkyl group, an oxy $C_{1-6}$ alkyl group, an oxy silylated $C_{1-6}$ alkyl group, a $C_{6-10}$ aryl group, an oxy $C_{6-10}$ aryl group, a silylated $C_{6-10}$ aryl group, an oxy silylated $C_{6-10}$ aryl group, a $C_{1-10}$ arylalkyl group, an oxy $C_{1-10}$ arylalkyl group, a silylated $C_{1-10}$ arylalkyl group, an oxy silylated $C_{1-10}$ arylalkyl group, a $C_{6-10}$ alkylaryl group, an oxy $C_{6-10}$ alkylaryl group, a silylated $C_{6-10}$ alkylaryl group and an oxy silylated $C_{6-10}$ alkylaryl group; more preferably, a $C_{1-3}$ alkyl group; most preferably, a methyl group); wherein r is selected from the group consisting of 0, 1, 2 and 3 (preferably, 1, 2 and 3; more preferably, r is 1); wherein $R^4$ is selected from the group consisting of a $C_{1-10}$ alkyl, a halogenated $C_{1-10}$ alkyl group, a silylated $C_{1-10}$ alkyl group, a silylated halogenated $C_{1-10}$ alkyl group, an oxy silylated $C_{1-10}$ alkyl group and a halogenated oxy silylated $C_{1-10}$ alkyl group (preferably, a $C_{1-3}$ alkyl group and a halogenated $C_{1-3}$ alkyl group; more preferably, a $C_{1-3}$ alkyl group; most preferably a methyl group); wherein x is selected from the group consisting of 0 and 1 (preferably, x is 1); wherein $R^5$ is selected from the group consisting of a hydrogen, a halogen, a $C_{1-3}$ alkyl group, a silylated $C_{1-3}$ alkyl group and a halogenated $C_{1-3}$ alkyl group (preferably, a hydrogen and a methyl group; more preferably, a methyl group); wherein each $R^6$ is independently selected from a hydrogen, a halogen, a silyl methyl group, a methyl group and a halogenated methyl group (preferably, a hydrogen and a methyl group; more preferably, a hydrogen); and, wherein the silyl acrylate monomer includes at least one Si atom. More preferably, the silyl acrylate monomer is selected from the group consisting of (trimethylsilyl)methyl (meth)acrylate; (triethylsilyl)methyl (meth)acrylate; (tripropylsilyl)methyl (meth)acrylate; (triisopropylsilyl)methyl (meth)acrylate; (tributylsilyl)methyl (meth)acrylate; (tri-sec-butylsilyl)methyl (meth)acrylate; (triisobutylsilyl)methyl (meth)acrylate; (sec-butylmethylsilyl)methyl (meth)acrylate; (sec-butyldimethylsilyl)methyl (meth)acrylate; (dimethylpropylsilyl)methyl (meth)acrylate; (monomethyldipropylsilyl)methyl (meth)acrylate; (methylethylpropylsilyl)methyl (meth)acrylate; bis(trimethylsilyl)methyl (meth)acrylate; tris(trimethylsilyl)methyl (meth)acrylate; (pentamethyldisilyl)methyl (meth)acrylate; tris(trimethylsiloxy)methyl (meth)acrylate; tris(trimethylsiloxy)propyl (meth)acrylate); (pentamethyldisiloxy)methyl (meth)acrylate; (pentamethyldisiloxy)propyl (meth)acrylate; (trimethoxysilyl)propyl (meth)acrylate; and, (triethoxysilyl)propyl (meth)acrylate. Most preferably, the silyl acrylate monomer is (trimethylsilyl)methyl methacrylate.

Preferably, the deuterated silyl acrylate monomer is according to the following formula

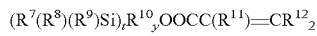

wherein each $R^7$, $R^8$ and $R^9$ is independently selected from a $C_{1-18}$ alkyl group, a halogenated $C_{1-18}$ alkyl group, a silylated $C_{1-18}$ alkyl group, a silylated halogenated $C_{1-18}$ alkyl group, an oxy $C_{1-18}$ alkyl group, an oxy silylated $C_{1-18}$ alkyl group, an oxy silylated halogenated $C_{1-18}$ alkyl group, a $C_{6-14}$ aryl group, a halogenated $C_{6-14}$ aryl group, an oxy $C_{6-14}$ aryl group, a silylated $C_{6-14}$ aryl group, an oxy silylated $C_{6-14}$ aryl group, an oxy silylated halogenated $C_{6-14}$ aryl group, a $C_{1-18}$ arylalkyl group, a halogenated $C_{1-18}$ arylalkyl group, an oxy $C_{1-18}$ arylalkyl group, a silylated $C_{1-18}$ arylalkyl group, a silylated halogenated $C_{1-18}$ arylalkyl group, an oxy silylated $C_{1-18}$ arylalkyl group, an oxy silylated halogenated $C_{1-18}$ arylalkyl group, a $C_{6-14}$ alkylaryl group, a halogenated $C_{6-14}$ alkylaryl group, an oxy $C_{6-14}$ alkylaryl group, a silylated $C_{6-14}$ alkylaryl group, an oxy silylated $C_{6-14}$ alkylaryl group, an oxy silylated halogenated $C_{6-14}$ alkylaryl group, a deuterated $C_{1-18}$ alkyl group, a deuterated halogenated $C_{1-18}$ alkyl group, a deuterated silylated $C_{1-18}$ alkyl group, a deuterated silylated halogenated $C_{1-18}$ alkyl group, a deuterated oxy $C_{1-18}$ alkyl group, a deuterated oxy silylated $C_{1-18}$ alkyl group, a deuterated oxy silylated halogenated $C_{1-18}$ alkyl group, a deuterated $C_{6-14}$ aryl group, a deuterated halogenated $C_{6-14}$ aryl group, a deuterated oxy $C_{6-14}$ aryl group, a deuterated silylated $C_{6-14}$ aryl group, a deuterated oxy silylated $C_{6-14}$ aryl group, a deuterated oxy silylated halogenated $C_{6-14}$ aryl group, a deuterated $C_{1-18}$ arylalkyl group, a deuterated halogenated $C_{1-18}$ arylalkyl group, a deuterated oxy $C_{1-18}$ arylalkyl group, a deuterated silylated $C_{1-18}$ arylalkyl group, a deuterated silylated halogenated $C_{1-18}$ arylalkyl group, a deuterated oxy silylated $C_{1-18}$ arylalkyl group, a deuterated oxy silylated halogenated $C_{1-18}$ arylalkyl group, a deuterated $C_{6-14}$ alkylaryl group, a deuterated halogenated $C_{6-14}$ alkylaryl group, a deuterated oxy $C_{6-14}$ alkylaryl group, a deuterated silylated $C_{6-14}$ alkylaryl group, a deuterated oxy silylated $C_{6-14}$ alkylaryl group and a deuterated oxy silylated halogenated $C_{6-14}$ alkylaryl group (preferably, a $C_{1-6}$ alkyl group, a silylated $C_{1-6}$ alkyl group, an oxy $C_{1-6}$ alkyl group, an oxy silylated $C_{1-6}$ alkyl group, a $C_{6-10}$ aryl group, an oxy $C_{6-10}$ aryl group, a silylated $C_{6-10}$ aryl group, an oxy silylated $C_{6-10}$ aryl group, a $C_{1-10}$ arylalkyl group, an oxy $C_{1-10}$ arylalkyl group, a silylated $C_{1-10}$ arylalkyl group, an oxy silylated $C_{1-10}$ arylalkyl group, a $C_{6-10}$ alkylaryl group, an oxy $C_{6-10}$ alkylaryl group, a silylated $C_{6-10}$ alkylaryl group, an oxy silylated $C_{6-10}$ alkylaryl group, a deuterated $C_{1-6}$ alkyl group, a deuterated silylated $C_{1-6}$ alkyl group, a deuterated oxy $C_{1-6}$ alkyl group, a deuterated oxy silylated $C_{1-6}$ alkyl group, a deuterated $C_{6-10}$ aryl group, a deuterated oxy $C_{6-10}$ aryl group, a deuterated silylated $C_{6-10}$ aryl group, a deuterated oxy silylated $C_{6-10}$ aryl group, a deuterated $C_{1-10}$ arylalkyl group, a deuterated oxy $C_{1-10}$ arylalkyl group, a deuterated silylated $C_{1-10}$ arylalkyl group, a deuterated oxy silylated $C_{1-10}$ arylalkyl group, a deuterated $C_{6-10}$ alkylaryl group, a deuterated oxy $C_{6-10}$ alkylaryl group, a deuterated silylated $C_{6-10}$ alkylaryl group and a deuterated oxy silylated $C_{6-10}$ alkylaryl group; more preferably, a $C_{1-3}$ alkyl group and a deuterated $C_{1-3}$ alkyl group; most preferably, a methyl group and a deuterated methyl group); wherein t is selected from the group consisting of 0, 1, 2 and 3 (preferably, 1, 2 and 3; more preferably, t is 1); wherein $R^{10}$ is selected from the group consisting of a $C_{1-10}$ alkyl, a halogenated $C_{1-10}$ alkyl group, a silylated $C_{1-10}$ alkyl group, a silylated halogenated $C_{1-10}$ alkyl group, an oxy silylated $C_{1-10}$ alkyl group, a halogenated oxy silylated $C_{1-10}$ alkyl group, a deuterated $C_{1-10}$ alkyl, a deuterated halogenated $C_{1-10}$ alkyl group, a deuterated silylated $C_{1-10}$ alkyl group, a deuterated silylated halogenated $C_{1-10}$ alkyl group, a deuterated oxy silylated $C_{1-10}$ alkyl group and a deuterated halogenated oxy silylated $C_{1-10}$ alkyl group (preferably, a $C_{1-3}$ alkyl group and a deuterated $C_{1-3}$ alkyl group; more preferably, a $C_{1-3}$ alkyl group; most preferably a methyl group); wherein y is 0 or 1 (preferably, y is 1); wherein $R^{11}$ is selected from the group consisting of a hydrogen, a deuterium, a halogen, a $C_{1-3}$ alkyl group, a deuterated $C_{1-3}$ alkyl group, a silylated $C_{1-3}$ alkyl group, a deuterated silylated $C_{1-3}$ alkyl group, a halogenated $C_{1-3}$ alkyl group and a deuterated halogenated $C_{1-3}$ alkyl group (preferably, a hydrogen, a deuterium, a methyl group and a deuterated methyl group; more preferably, a methyl group); wherein each $R^{12}$ is independently selected from a hydrogen, a deuterium, a halogen, a silyl methyl group, a deuterated silyl methyl group, a methyl group, a deuterated methyl group, a halogenated methyl group and a deuterated halogenated methyl group (preferably, a hydrogen, a deuterium, a methyl group and a deuterated methyl group; more preferably, a hydrogen); wherein the deuterated silyl acrylate monomer contains at least one Si atom; and, wherein the deuterated silyl acrylate monomer contains at least one deuterium. More preferably, the deuterated silyl acrylate monomer is selected from the group consisting of deuterated (trimethylsilyl)methyl (meth)acrylate; deuterated (triethylsilyl)methyl (meth)acrylate; deuterated (tripropylsilyl)methyl (meth)acrylate; deuterated (triisopropylsilyl)methyl (meth)acrylate; deuterated (tributylsilyl)methyl (meth)acrylate; deuterated (tri-sec-butylsilyl)methyl (meth)acrylate; deuterated (triisobutylsilyl)methyl (meth) acrylate; deuterated (sec-butylmethylsilyl)methyl (meth) acrylate; deuterated (sec-butyldimethylsilyl)methyl (meth) acrylate; deuterated (dimethylpropylsilyl)methyl (meth) acrylate; deuterated (monomethyldipropylsilyl)methyl (meth)acrylate; deuterated (methylethylpropylsilyl)methyl (meth)acrylate; deuterated bis(trimethylsilyl)methyl (meth) acrylate; deuterated tris(trimethylsilyl)methyl (meth)acrylate; deuterated (pentamethyldisilyl)methyl (meth)acrylate; deuterated tris(trimethylsiloxy)methyl (meth)acrylate; deuterated tris(trimethylsiloxy)propyl (meth)acrylate); deuterated (pentamethyldisiloxy)methyl (meth)acrylate; deuterated (pentamethyldisoloxy)propyl (meth)acrylate; deuterated (trimethoxysilyl)propyl (meth)acrylate; and, deuterated (triethoxysilyl)propyl (meth)acrylate. Most preferably, the deuterated silyl acrylate monomer is deuterated (trimethylsilyl) methyl methacrylate.

Preferably, the silyl acrylate block modifying monomer is selected from the group consisting of an alkene and a cycloalkene. More preferably, the silyl acrylate block modifying monomer is selected from a $C_{1-5}$ alkene and a $C_{3-7}$ cycloalkene. Most preferably, the silyl acrylate block modifying monomer is ethylene.

Preferably, the deuterated silyl acrylate block modifying monomer is selected from the group consisting of a deuterated alkene and a deuterated cycloalkene. More preferably, the deuterated silyl acrylate block modifying monomer is selected from a deuterated $C_{1-5}$ alkene and deuterated a $C_{3-7}$ cycloalkene. Most preferably, the deuterated silyl acrylate block modifying monomer is deuterated ethylene.

Preferably, the copolymer composition of the present invention contains ≥2 wt % antioxidant (based on the weight of the PAcr-b-PSiAcr block copolymer). More preferably, the copolymer composition contains 2 to 30 wt % antioxidant (based on the weight of the PAcr-b-PSiAcr block copolymer). Still more preferably, the copolymer composition contains 5 to 30 wt % antioxidant (based on the weight of the PAcr-b-PSiAcr block copolymer). Still more preferably, the copolymer composition contains 10 to 25 wt % antioxidant (based on the weight of the PAcr-b-PSiAcr block copolymer). Most preferably, the copolymer composition contains 15 to 25 wt % antioxidant (based on the weight of the PAcr-b-PSiAcr block copolymer).

Antioxidant contained in the copolymer composition of the present invention can be selected from primary antioxidants and secondary antioxidants. Preferably, the antioxidant is selected from the group consisting of: antioxidants containing at least one (preferably at least two; more preferably at least three; most preferably three to four) 2,6-di-tert-butylphenol moiety; antioxidants containing at least one (preferably at least two; more preferably at least three; most preferably three to four) moiety according to the formula

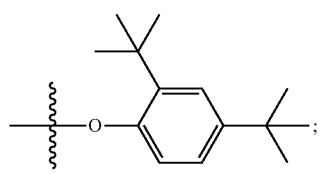

antioxidants containing at least one (preferably at least two; most preferably two) moiety according to the formula

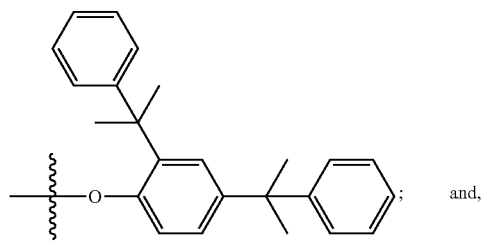 [SMILES: *Oc1ccc(C(C)(C)c2ccccc2)cc1C(C)(C)c1ccccc1]

and, antioxidants containing at least one (preferably at least two; most preferably two) moiety according to the formula

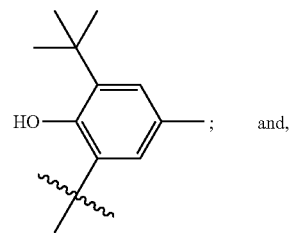 [SMILES: *c1cc(C)cc(C(C)(C)C)c1O]

and, mixtures thereof. More preferably, the antioxidant is selected from the group consisting of:

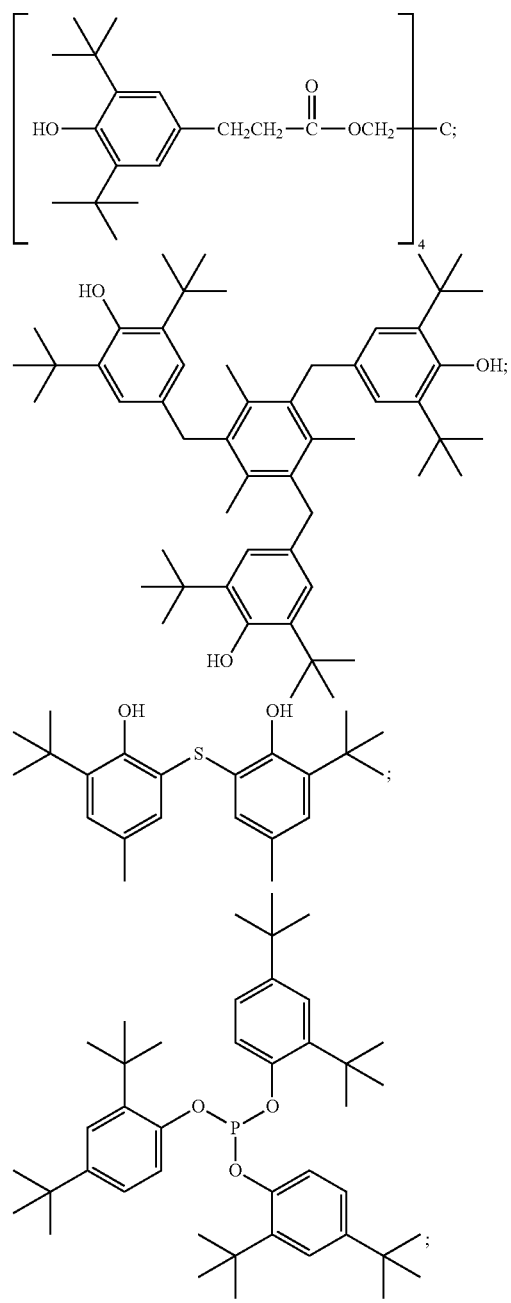

-continued

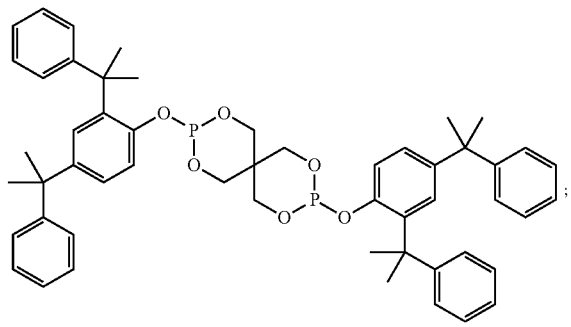

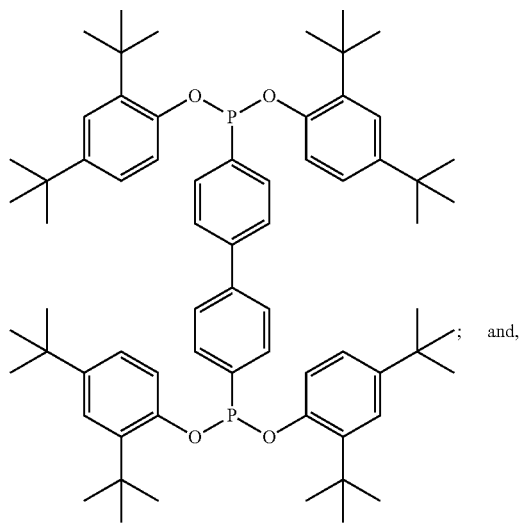

mixtures thereof. Still more preferably, the antioxidant is selected from the group consisting of

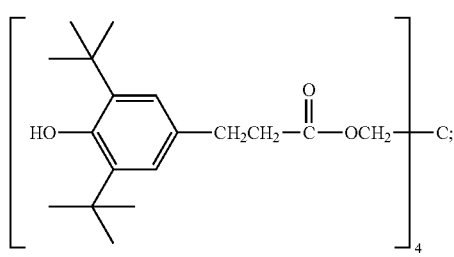

and mixtures of

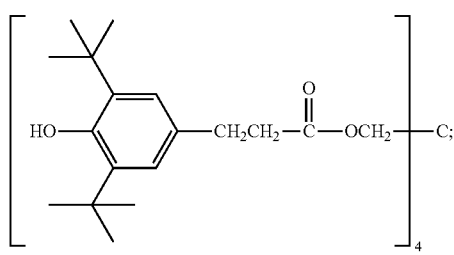

and one or more other antioxidants. Most preferably, the antioxidant is

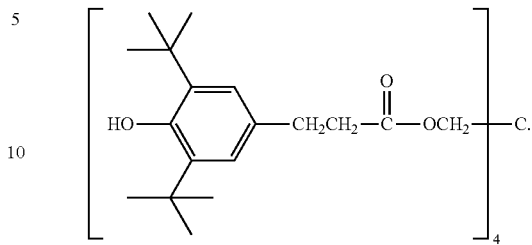

Preferably, the antioxidant (or mixture of antioxidants) contained in the copolymer composition of the present invention has an average molecular weight of ≥358 g/mol. More preferably, the antioxidant (or mixture of antioxidants) contained in the copolymer composition of the present invention has an average molecular weight of ≥600 g/mol. Most preferably, the antioxidant (or mixture of antioxidants) contained in the copolymer composition of the present invention has an average molecular weight of ≥1,000 g/mol.

Preferably, the antioxidant (or mixture of antioxidants) contained in the copolymer composition of the present invention has an average boiling point temperature measured at 760 mm Hg (101.3 kPa) of >400° C. More preferably, the antioxidant (or mixture of antioxidants) contained in the copolymer composition of the present invention has an average boiling point temperature measured at 760 mm Hg (101.3 kPa) of >500° C. Still more preferably, the antioxidant (or mixture of antioxidants) contained in the copolymer composition of the present invention has an average boiling point temperature measured at 760 mm Hg (101.3 kPa) of >700° C. Yet still more preferably, the antioxidant (or mixture of antioxidants) contained in the copolymer composition of the present invention has an average boiling point temperature measured at 760 mm Hg (101.3 kPa) of >800° C. Most preferably, the antioxidant (or mixture of antioxidants) contained in the copolymer composition of the present invention has an average boiling point temperature measured at 760 mm Hg (101.3 kPa) of >1,000° C.

The copolymer composition of the present invention optionally further comprises a solvent. Solvents include liquids that are able to disperse the block copolymer into particles or aggregates having an average hydrodynamic diameter of less than 50 nm as measured by dynamic light scattering. Preferably, the solvent used is selected from propylene glycol monomethyl ether acetate (PGMEA), ethoxyethyl propionate, anisole, ethyl lactate, 2-heptanone, cyclohexanone, amyl acetate, γ-butyrolactone (GBL), n-methylpyrrolidone (NMP) and toluene. More preferably, the solvent used is selected from propylene glycol monomethyl ether acetate (PGMEA) and toluene. Most preferably, the solvent used is toluene.

The copolymer composition of the present invention optionally further comprises an additive. Additives include additional polymers (including homopolymers and random copolymers); surfactants; photoacid generators; thermal acid generators; quenchers; hardeners; adhesion promoters; dissolution rate modifiers; photocuring agents; photosensitizers; acid amplifiers; plasticizers; orientation control agents; and cross linking agents. Preferred additives for use in the copolymer composition of the present invention include surfactants.

The method of the present invention preferably comprises: providing a substrate; providing a copolymer composition of the present invention; applying a film of the copolymer composition to the substrate; optionally, baking the film; annealing the film, leaving a pattern of poly(acrylate) domains and poly(silyl acrylate) domains; treating the annealed film to remove the poly(acrylate) domains from the annealed film and to convert the poly(silyl acrylate) domains in the annealed film to $SiO_x$.

Substrates used in the method of the present invention include any substrate having a surface that can be coated with the copolymer composition of the present invention. Preferred substrates include layered substrates. Preferred substrates include silicon containing substrates (e.g., glass; silicon dioxide; silicon nitride; silicon oxynitride; silicon containing semiconductor substrates such as silicon wafers, silicon wafer fragments, silicon on insulator substrates, silicon on sapphire substrates, epitaxial layers of silicon on a base semiconductor foundation, silicon-germanium substrates); plastic; metals (e.g., copper, ruthenium, gold, platinum, aluminum, titanium and alloys); titanium nitride; and non-silicon containing semiconductive substrates (e.g., non-silicon containing wafer fragments, non-silicon containing wafers, germanium, gallium arsenide and indium phosphide). Most preferred substrates are silicon containing substrates.

Optionally, the surface of the substrate to be coated with the copolymer composition of the present invention is pretreated with an interposing material before the copolymer composition of the present invention is applied. Preferably, the pretreatment material acts like a tying layer interposed between the surface of the substrate and the block copolymer in the copolymer composition of the present invention to enhance the adhesion between the block copolymer and the substrate. Preferably, the interposing material forms a layer selected from an imaging layer and an orientation control layer.

Imaging layers suitable for use in the method of the present invention include, for example, any type of material that can be patterned or selectively activated. Such materials include, for example, polymer brushes and a self-assembled monolayers of silane and siloxane compounds.

Orientation control layers suitable for use in the method of the present invention include neutral and non-neutral orientation control layers. That is, the orientation control layer can form an interface between the surface of the substrate and the block copolymer in the copolymer composition of the present invention that is preferentially wetted by one of poly(acrylate) domains or poly(silyl acrylate) domains—i.e., a non-neutral orientation control layer. A neutral orientation control layer refers to a layer that forms an interface between the surface of the substrate and the block copolymer in the copolymer composition of the present invention that is equally wetted by both poly(acrylate) and poly(silyl acrylate). Neutral orientation control layers preferably include films prepared by casting a random copolymer that comprises residues of both acrylate monomers and silyl acrylate monomers (e.g., poly(methyl methacrylate)-r-(trimethylsilyl)methyl methacrylate)-OH).

Preferably, the pretreatment of the substrate before depositing the copolymer composition of the present invention is performed to facilitate the guided self assembly of the block copolymer in the copolymer composition. Specifically, the pretreatment can facilitate one of the two conventional methods used for guided self assembly of block copolymer films, namely graphoepitaxy and chemical epitaxy. In the graphoepitaxy, the surface of the substrate is prepatterned with topographical features on the surface of substrate (e.g., trenches, holes) that operate to direct the self organization of the blocks in the block copolymer.

In the chemical epitaxy, the surface of the substrate is treated with a film that exhibits a compositional pattern, wherein the affinity between the various parts of the compositional pattern is different for poly(acrylate) and poly(silyl acrylate). This chemical affinity difference operates to facilitate the directed self assembly of the block copolymer in the copolymer composition.

Preferably, the interposing layer is formed on the substrate using a method selected from spin coating, dip coating, roll coating, spray coating and laminating (most preferably spin coating). After application of the interposing layer forming material onto the surface of the substrate, the material is optionally further processed to remove any residual solvent. Preferably, the interposing layer is baked at an elevated temperature (e.g., 70 to 340° C.) for at least 10 seconds to 5 minutes to remove any residual solvent from the interposing layer. Preferably, the baked interposing layer is rinsed with a solvent capable of removing any residual unbound interposing layer material from the surface of the substrate and then rebaked at an elevated temperature (e.g., 70 to 340° C.) for at least 10 seconds to 5 minutes to remove any residual solvent.

Applying a film of the copolymer composition of the present invention to the substrate in the method of the present invention preferably comprises depositing the copolymer composition onto the substrate using a method selected from spin coating, dip coating, roll coating, spray coating and laminating (most preferably spin coating). After application of the copolymer composition to the substrate, the deposited copolymer composition is optionally further processed to remove any residual solvent. Preferably, the deposited copolymer composition is baked at an elevated temperature (e.g., 70 to 340° C.) for at least 10 seconds to 5 minutes to remove any residual solvent from the deposited film of the copolymer composition.

Annealing of the deposited film can be done by any annealing technique, for example, thermal annealing, thermal gradient annealing and solvent vapor annealing. Preferably, the film is annealed using a thermal annealing technique. More preferably, the deposited film is annealed using a thermal annealing technique, wherein the deposited film is heated at a temperature of 200 to 340° C. (more preferably 200 to 300° C.; most preferably 225 to 300° C.) for a period of 0.5 minute to 2 days (more preferably 0.5 minute to 2 hours; still more preferably 0.5 minute to 0.5 hour; most preferably 0.5 minute to 5 minutes). Preferably, the deposited film is annealed using a thermal annealing technique under a gaseous atmosphere, wherein the gaseous atmosphere is selected from an atmosphere containing ≥20 wt % oxygen and an atmosphere containing <20 wt % oxygen. More preferably, the deposited film is thermally annealed under a gaseous atmosphere, wherein the gaseous atmosphere is selected from a gaseous nitrogen atmosphere and a gaseous argon atmosphere, wherein the gaseous atmosphere has an oxygen concentration of ≤150 ppm (more preferably, ≤10 ppm; still more preferably, ≤7.5 ppm; yet still more preferably, ≤6.5 ppm; most preferably, ≤5 ppm). Most preferably, the deposited film is thermally annealed under a gaseous nitrogen atmosphere having an oxygen concentration of ≤100 ppm (preferably, ≤7.5 ppm; more preferably, ≤6.5 ppm; most preferably, ≤5 ppm).

In the method of the present invention, the annealed film is treated to remove the poly(acrylate) domains in the annealed film and to convert the poly(silyl acrylate) domains in the annealed film to $SiO_x$, providing a product film with a plurality of voids (i.e., trench shaped voids perpendicular to the surface of the substrate; cylindrical holes with axes of symmetry perpendicular to the surface of the substrate; a plurality of cylindrical $SiO_x$ posts with axes of symmetry perpendicular to the surface of the substrate). The treatment comprises: exposing the film to conditions that exhibit differential reactivity towards the poly(acrylate) in the film relative to the poly(silyl acrylate) in the film, to facilitate removal of the poly(acrylate) domains from the annealed film and the conversion of the poly(silyl acrylate) domains to $SiO_x$. Preferably, the treatment comprises: optionally, exposing the annealed film to a halogen containing plasma (e.g., $CF_4$) to remove any wetting layer that formed on the surface of the annealed film; followed by exposing the annealed film to a reactive plasma or a reactive ion etching atmosphere to remove the poly(acrylate) domains and to convert the poly(silyl acrylate) domains to $SiO_x$. Most preferably, the treatment comprises: exposing the annealed film to a halogen containing plasma to remove any wetting layer formed on the annealed film; and then exposing the annealed film to a reactive plasma or a reactive ion etching atmosphere, wherein the atmosphere comprises a plasma composed of a low pressure ionized oxidizing gas (preferably $O_2$); wherein the poly(acrylate) domains in the annealed film is removed and the poly(silyl acrylate) domains in the annealed film is converted to $SiO_x$.

Some embodiments of the present invention will now be described in detail in the following Examples.

The following materials were passed through a column packed with activated A-2 grade alumina before being used in the Examples herein, namely tetrahydrofuran (99.9% pure available from Aldrich), styrene (available from Aldrich), and cyclohexane (HPCL grade available from Fischer). The following materials were passed through a column packed with basic alumina before being used in the Examples herein, namely 1,1-diphenylethylene (available from Aldrich) and methyl methacrylate (MMA). All the other materials used in the Examples herein were commercial materials that were used as received.

The film thicknesses reported in the Examples herein were measured using a NanoSpec/AFT 2100 Film Thickness Measurement tool. The thickness of the films were determined from the interference of a white light passed through a diffraction grating. A standard program called "Polyimide on Silicon" was used to analyze the component wavelengths (380-780 nm) to determine the film thickness. The thickness of the film of the deposited block copolymer composition and the brush layer were measured together as one polymeric layer. The reported film thickness is the combined thickness of the deposited block copolymer composition and the brush layer.

The number average molecular weight, $M_N$, and polydispersity values reported in the Examples were measured by gel permeation chromatography (GPC) on an Agilent 1100 series LC system equipped with an Agilent 1100 series refractive index and MiniDAWN light scattering detector (Wyatt Technology Co.). Samples were dissolved in HPCL grade THF at a concentration of approximately 1 mg/mL and filtered through at 0.20 μm syringe filter before injection through the two PLGel 300×7.5 mm Mixed C columns (5 mm, Polymer Laboratories, Inc.). A flow rate of 1 mL/min and temperature of 35° C. were maintained. The columns were calibrated with narrow molecular weight PS standards (EasiCal PS-2, Polymer Laboratories, Inc.).

Proton nuclear magnetic resonance ($^1$H NMR) spectroscopy results referred to in the Examples was done on a Varian INOVA 400 MHz NMR spectrometer. Deuterated chloroform was used. A delay time of 10 seconds was used to ensure complete relaxation of protons for quantitative integrations. Chemical shifts are reported relative to tetramethylsilane.

A PlasmaTherm 790i/reactive ion etch platform was used for all of the reactive ion etching steps mentioned in the Examples.

The film pitch, $L_0$, for the films reported in the Examples was measured using image analysis of the SEMS of the films with ImageJ, a public domain, JAVA based image processing program. Spatial calibration was first carried out to convert distance in pixels in the image to distances in nanometers for a given SEM image. To measure the film pitch, a line was drawn across and perpendicular to multiple $SiO_x$ cylinders. The film pitch was calculated by dividing the length of the drawn line by (n−1), wherein n is the number of $SiO_x$ cylinders crossed by the drawn line.

Example 1

Preparation of Hydroxyl-Terminated Polystyrene Brush

Into a 2 liter glass reactor under a nitrogen atmosphere was added cyclohexane (1,500 g). Styrene (50.34 g) was then added to the reactor via cannula. The contents of the reactor were then heated to 40° C. Sec-butyllithium (19.18 g) diluted in cyclohexane to a concentration of 0.32 M was then rapidly added to the reactor via cannula, causing the reactor contents to turn yellow. The contents of the reactor were stirred for 30 minutes. The contents of the reactor were then cooled to 30° C. Ethylene oxide (0.73 g) was then transferred into the reactor. The contents of the reactor were stirred for 15 minutes. Then a 20 mL of a 1.4 M solution of HCl in methanol was added to the reactor. The polymer in the reactor was then isolated by precipitating into isopropanol at a ratio of 500 mL of polymer solution to 1,250 mL of isopropanol. The resulting precipitate was then filtered and dried overnight in a vacuum oven at 60° C., yielding 42 g of product hydroxyl-terminated polystyrene. The product hydroxyl-terminated polystyrene exhibited a number average molecular weight, $M_N$, of 7.4 kg/mol and a polydispersity, PD, of 1.07.

Comparative Example C1

Preparation of PS-b-PDMS Diblock Copolymer

Into a 500 mL 3-neck round bottom reactor under an argon atmosphere was added cyclohexane (90 mL) and styrene (18.4 g). The contents of the reactor were then warmed to 40° C. A 0.5 mL shot of a 1.4 M solution of sec-butyllithium in cyclohexane was then rapidly added to the reactor via cannula, causing the reactor contents to turn yellow-orange. The reactor contents were allowed to stir for 30 minutes. A small portion of the reactor contents was then withdrawn from the reactor into a small round bottomed flask containing anhydrous methanol for gel permeation chromatography analysis of the polystyrene block formed. Next 2,2,5,5-tetramethyldisilafuran (337 mg) was added to the reactor. Slowly the orange color began to fade. After 1 hour the contents of the reactor were a slight yellow. Then a freshly sublimed hexamethylcyclotrisiloxane (10.1 g) was then transferred to the reactor via cannula. The reactor contents were allowed to react for 1.5 hours until the reactor contents were colorless. Then dry tetrahydrofuran (90 mL) was added to the reactor and the reaction was allowed to proceed for 3.25 hours. Chlorotrimethylsilane (1 mL) was then added to the reactor to quench the reaction. The product was isolated by precipitating into 500 mL of methanol and filtering. After washing with additional methanol, the polymer was redissolved in 150 mL of methylene chloride, washed three times with deionized water and then reprecipitated into 500 mL of methanol. The polymer was then filtered and dried overnight in a vacuum oven at 70° C., yielding 22.1 g. The poly(styrene)-b-poly (dimethyl siloxane) block copolymer ("PS-b-PDMS") product exhibited a number average molecular weight, $M_N$, of 35.8 kg/mol; a polydispersity, PD, of 1.01 and a 25.0 wt % PDMS content (as determined by $^1$H NMR).

Example 2

Preparation PMMA-b-PTMSMMA Diblock Copolymer

Into a 500 mL 3-neck round bottom reactor under an argon atmosphere was added tetrahydrofuran ("THF") (113 g). The THF was then cooled in the reactor to −78° C. The contents of the reactor were then titrated with a 0.36 M solution of sec-butyllithium in cyclohexane until the contents of the reactor exhibited a persistent pale yellow color. The contents of the reactor were then warmed to, and maintained at, 30° C. until the color of the contents completely disappeared (approximately 10-15 minutes). 1,1-diphenylethylene (0.116 g) diluted in cyclohexane (2.278 g) was then transferred to the reactor via cannula. The contents of the reactor were then cooled to −78° C. Sec-butyllithium (6.15 g) diluted with cyclohexane to concentration of 0.065 M was then rapidly added to the reactor via cannula, causing the reactor contents to turn a dark ruby red. The reactor contents were allowed to stir for 10 minutes. Then methyl methacrylate (11.53 g) in cyclohexane (5.31 g) was transferred to the reactor via cannula, causing the color of the reactor contents to disappear. The reactor contents exhibited a 21° C. temperature rise within 1 minute of the addition of the methyl methacrylate to the reactor. The contents of the reactor then cooled back down to −78° C. and the reactor contents were stirred for an additional 60 minutes. A small portion of the reactor contents was then withdrawn for gel permeation chromatography analysis of the polymethyl methacrylate ("PMMA") block formed. (Trimethylsilyl) methyl methacrylate ("TMSMMA") (4.52 g) diluted in cyclohexane (4.86 g) was then transferred into the reactor via cannula. Within 2 minutes of the addition of the TMSMMA to the reactor, the reactor contents warmed to −69° C. before cooling back down to −78° C. The reactor contents were stirred for an additional 2.5 hours, after which the reaction was quenched by the addition of anhydrous methanol to the reactor. The reactor contents were then precipitated into 1 liter of methanol. The product solids were collected by vacuum filtration. After washing with additional methanol, the polymer was redissolved in 150 mL of methylene chloride, washed twice with deionized water and then reprecipitated into 1 liter of methanol. The polymer was then filtered and dried overnight in a vacuum oven at 60° C., yielding 15.1 g. The product poly(methyl methacrylate)-b-poly(trimethylsilyl) methyl methacrylate block copolymer ("PMMA-b-PTMSMMA") exhibited a weight average molecular weight, $M_W$, of 31.4 kg/mol; a polydispersity, PD, of 1.21 and a 30 wt % poly(trimethylsilyl)methyl methacrylate content (as determined by $^1$H NMR).

Example 3

Preparation PMMA-b-PTMSMMA Diblock Copolymer

Into a 500 mL 3-neck round bottom reactor under an argon atmosphere was added tetrahydrofuran ("THF") (142 g). The THF was then cooled in the reactor to −78° C. The contents of the reactor were then titrated with a 0.36 M solution of sec-butyllithium in cyclohexane until the contents of the reactor exhibited a persistent pale yellow color. The contents of the reactor were then warmed to, and maintained at, 30° C. until the color of the contents completely disappeared (approximately 10-15 minutes). 1,1-diphenylethylene (0.086 g) diluted in cyclohexane (1.63 g) was then transferred to the reactor via cannula. The contents of the reactor were then cooled to −78° C. Sec-butyllithium (4.5 g) diluted with cyclohexane to concentration of 0.065 M was then rapidly added to the reactor via cannula, causing the reactor contents to turn a dark ruby red. The reactor contents were allowed to stir for 21 minutes. Then methyl methacrylate (11.5 g) in cyclohexane (17.81 g) was transferred to the reactor via cannula, causing the color of the reactor contents to disappear. The reactor contents exhibited a 15-20° C. temperature rise within 1 minute of the addition of the methyl methacrylate to the reactor. The contents of the reactor then cooled back down to −78° C. and the reactor contents were stirred for an additional 30 minutes. A small portion of the reactor contents was then withdrawn for gel permeation chromatography analysis of the polymethyl methacrylate ("PMMA") block formed. (Trimethylsilyl) methyl methacrylate ("TMSMMA") (4.27 g) diluted in cyclohexane (10.26 g) was then transferred into the reactor via cannula. Within 2 minutes of the addition of the TMSMMA to the reactor, the reactor contents warmed to −70° C. before cooling back down to −78° C. The reactor contents were stirred for an additional 3.75 hours, after which the reaction was quenched by the addition of anhydrous methanol to the reactor. The reactor contents were then precipitated into 1 liter of methanol. The product solids were collected by vacuum filtration. After washing with additional methanol, the polymer was redissolved in 150 mL of methylene chloride, washed twice with deionized water and then reprecipitated into 1 liter of methanol. The polymer was then filtered and dried overnight in a vacuum oven at 60° C., yielding 15.1 g. The product poly(methyl methacrylate)-b-poly(trimethylsilyl) methyl methacrylate block copolymer ("PMMA-b-PTMSMMA") exhibited a weight average molecular weight, $M_W$, of 42.0 kg/mol; a polydispersity, PD, of 1.18 and a 28 wt % poly(trimethylsilyl)methyl methacrylate content (as determined by $^1$H NMR).

Example 4

Substrate Preparation

Substrates were prepared by cutting pieces (~1"×1") from a silicon wafer having a native oxide layer. A hydroxyl-terminated polystyrene brush prepared according to Example 1 was dissolved in toluene to form 1.5 wt % brush solution. The brush solution was then spin coated onto each substrate at 3,000 rpm for 1 minute. The deposited brush layer was then baked by placing the substrate onto a hotplate set at 150° C. for 1 minute. The deposited brush layer was then annealed by placing the substrate onto another hotplate set at 250° C. for 20 minutes in a nitrogen atmosphere. The substrate was then cooled to room temperature. The substrate was then immersed in toluene for 1 minute. The substrate was then spun dry at 3,000 rpm for 1 minute. The substrate was then placed on a hotplate set at 110° C. for 1 minute and then stored in nitrogen until used.

Comparative Example F1

Film Deposition-Self Assembly

A PS-b-PDMS block copolymer prepared according to Comparative Example C1 was dissolved in propylene glycol methyl ether acetate ("PGMEA")(Dowanol® PMA available from The Dow Chemical Company) to form a 1.6 wt % solution. The solution was then hand filtered through a 0.2 µm Whatman syringe filter. The filtered solution was then spin coated onto the polystyrene brushed surface of a substrate prepared according to Example 4 at 2,370 rpm to form a 41.5 nm PS-b-PDMS film. The substrate was then placed on a hotplate set at 150° C. for 1 minute to bake the film. The substrate was then placed on another hotplate set at 250° C. for 1 hour under 50 psig nitrogen to anneal the PS-b-PDMS film.

A surface wetting layer of PDMS formed on the annealed film at the atmosphere-film interface. The annealed film was then treated using two consecutive reactive ion etching (RIE) steps to reveal the block copolymer morphology of the deposited PS-b-PDMS film. First, a short $CF_4$ plasma (10 mT, 50 W) RIE treatment (8 seconds post plasma stabilization) was used to punch through the surface wetting layer of PDMS. Then, an $O_2$ plasma RIE treatment (25 seconds post plasma stabilization) was employed to remove the polystyrene domains and convert the PDMS domains to $SiO_x$.

The plasma treated film was then examined by Scanning Electron Microscopy using a Hitachi S-4500 scanning electron microscope (SEM) with a secondary electron detector. The test sample was mounted on the SEM stage using double sided carbon tape and cleaned by blowing nitrogen prior to analysis. An image of the test sample was collected at 50,000× magnification and working distances between 4 and 8. The film exhibited a pitch of 32.0 nm.

Comparative Example F2

Film Deposition-Self Assembly

A PMMA-b-PTMSMMA block copolymer prepared according to Example 2 was dissolved in propylene glycol methyl ether acetate (PGMEA) to form a 1.2 wt % solution. The solution was then hand filtered through a 0.2 µm Whatman syringe filter. The filtered solution was then spin coated onto a polystyrene brushed surface of a substrate prepared according to Example 4 to form a PMMA-b-PTMSMMA film. The substrate was then placed on a hotplate set at 150° C. for 1 minute to bake the film. The substrate was then placed on another hotplate set at 290° C. under air for 2 min.

A surface wetting layer of PTMSMMA formed on the annealed film at the atmosphere-film interface. The annealed film was then treated using two consecutive reactive ion etching (RIE) steps to reveal the block copolymer morphology of the deposited PMMA-b-PTMSMMA film. First, a short $CF_4$ plasma (10 mT, 50 W) RIE treatment (8 seconds post plasma stabilization) was used to punch through the surface wetting layer of PTMSMMA. Then, an $O_2$ plasma RIE treatment (25 seconds post plasma stabilization) was employed to remove the poly(methyl methacrylate) domains and converting the PTMSMMA domains to $SiO_x$.

The plasma treated product film was then examined by Scanning Electron Microscopy using a Hitachi S-4500 scanning electron microscope (SEM) with a secondary electron detector. The test sample was mounted on the SEM stage using double sided carbon tape and cleaned by blowing nitrogen prior to analysis. An image of the test sample was collected at 50,000× magnification and working distances between 4 and 8. The product film exhibited a pitch of 36.3 nm.

Example 5

Film Deposition-Self Assembly

A formulation of PMMA-b-PTMSMMA block copolymer prepared according to Example 2 and 5 wt % of the antioxidant pentaerythritol tetrakis(3-(3,5-di-tert-butyl-4-hydroxyphenyl)propionate) (Available from BASF under the tradename IRGANOX® 1010) was dissolved in propylene glycol methyl ether acetate (PGMEA) to form a 1.2 wt % solution. The solution was then hand filtered through a 0.2 µm Whatman syringe filter. The filtered solution was then spin coated onto a polystyrene brushed surface of a substrate prepared according to Example 4 to form a PMMA-b-PTMSMMA film. The substrate was then placed on a hotplate set at 150° C. for 1 minute to bake the film. The substrate was then placed on another hotplate set at 290° C. under air for 2 min.

A surface wetting layer of PTMSMMA formed on the annealed film at the atmosphere-film interface. The annealed film was then treated using two consecutive reactive ion etching (RIE) steps to reveal the block copolymer morphology of the deposited PMMA-b-PTMSMMA film. First, a short $CF_4$ plasma (10 mT, 50 W) RIE treatment (8 seconds post plasma stabilization) was used to punch through the surface wetting layer of PTMSMMA. Then, an $O_2$ plasma RIE treatment (25 seconds post plasma stabilization) was employed to remove the poly(methyl methacrylate) domains and converting the PTMSMMA domains to $SiO_x$.

The plasma treated product film was then examined by Scanning Electron Microscopy using a Hitachi S-4500 scanning electron microscope (SEM) with a secondary electron detector. The test sample was mounted on the SEM stage using double sided carbon tape and cleaned by blowing nitrogen prior to analysis. An image of the test sample was collected at 50,000× magnification and working distances between 4 and 8. The product film exhibited a pitch of 35.7 nm with no apparent, detrimental effects from the elevated antioxidant concentration.

We claim:

1. A copolymer composition, comprising:
   a block copolymer having a poly(acrylate) block and a poly(silyl acrylate) block; and,
   an antioxidant;
   wherein the block copolymer exhibits a number average molecular weight, $M_N$, of 1 to 1,000 kg/mol; wherein the copolymer composition contains ≥2 wt % antioxidant (based on the weight of the block copolymer) and,
   wherein the block copolymer exhibits a polydispersity, PD, of 1 to 2.

2. The copolymer composition of claim 1, wherein the copolymer composition contains 5 to 30 wt % antioxidant (based on the weight of the block copolymer).

3. The copolymer composition of claim 1, wherein the antioxidant is selected from the group consisting of:

an antioxidant containing at least one 2,6-di-tert-butylphenol moiety;

an antioxidant containing at least one moiety according to the formula

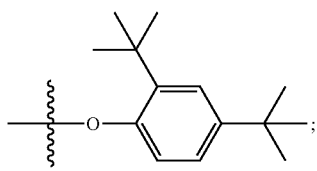

an antioxidant containing at least one moiety according to the formula

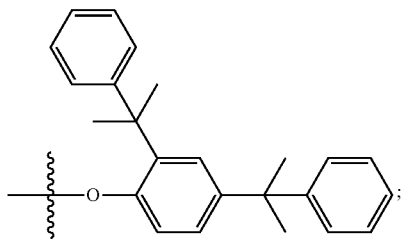 [SMILES: *Oc1ccc(C(C)(C)c2ccccc2)cc1C(C)(C)c1ccccc1]

an antioxidants containing at least one moiety according to the formula

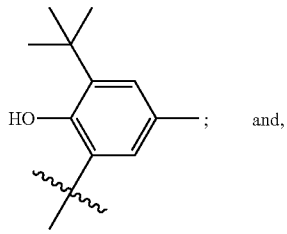  and, mixtures thereof.

4. The copolymer composition of claim 1, wherein the antioxidant is selected from the group consisting of

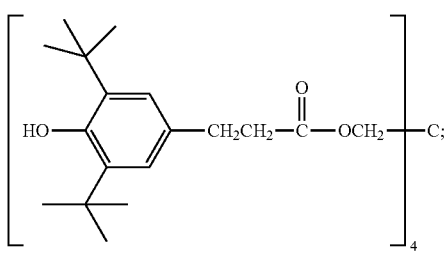

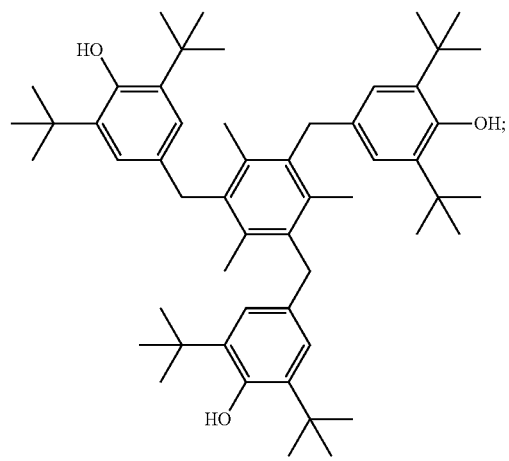

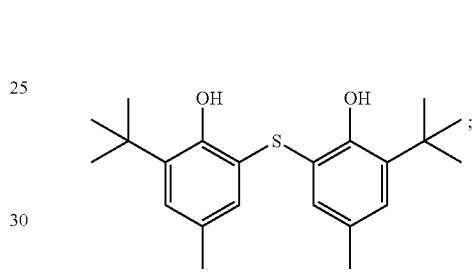

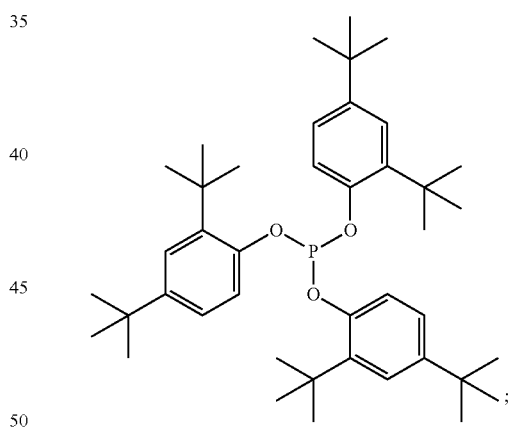

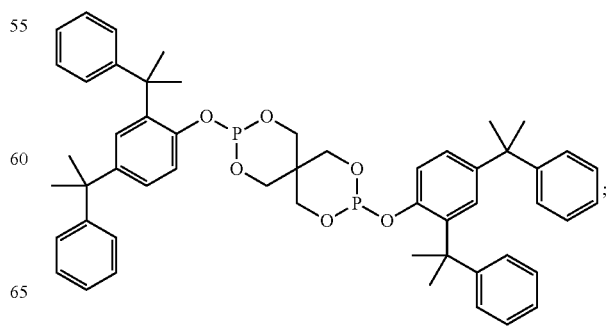

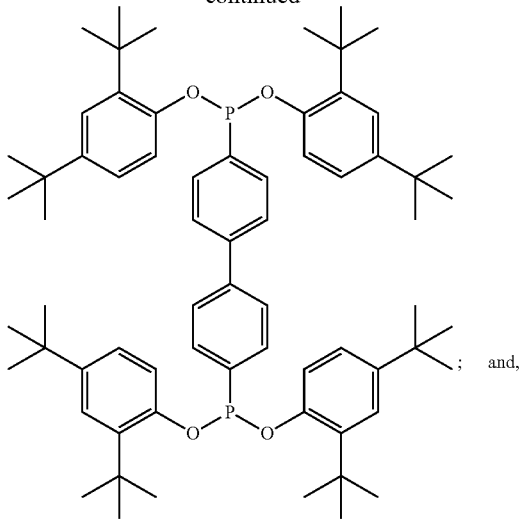

mixtures thereof.

5. The copolymer composition of claim 1,
wherein the poly(acrylate) block includes residues from at least one of an acrylate monomer, a deuterated acrylate monomer, an acrylate block modifying monomer and a deuterated acrylate block modifying monomer; wherein the poly(acrylate) block includes >75 wt % of acrylate monomer derived units; wherein the acrylate monomer is selected from the group consisting of $C_{6-14}$ aryl ($C_{1-5}$ alkyl)acrylate; $C_{1-5}$ alkyl ($C_{1-5}$ alkyl)acrylate; wherein the deuterated acrylate monomer is selected from the group consisting of deuterated $C_{6-14}$ aryl ($C_{1-5}$ alkyl) acrylate; deuterated $C_{1-5}$ alkyl ($C_{1-5}$ alkyl)acrylate; wherein the acrylate block modifying monomer is selected from the group consisting of a $C_{1-5}$ alkene and a $C_{3-7}$ cycloalkene; wherein the deuterated acrylate block modifying monomer is selected from a deuterated $C_{1-5}$ alkene and deuterated a $C_{3-7}$ cycloalkene; and,
wherein the poly(silyl acrylate) block includes residues from at least one of a silyl acrylate monomer, a deuterated silyl acrylate monomer, a silyl acrylate block modifying monomer and a deuterated silyl acrylate block modifying monomer; wherein the poly(silyl acrylate) block includes >75 wt % silyl acrylate monomer derived units; wherein the silyl acrylate monomer is according to the following formula $(R^1)(R^2)(R^3)Si)_rR^4_xOOCC(R^5)=CR^6_2$ wherein each $R^1$, $R^2$ and $R^3$ is independently selected from the group consisting of a $C_{1-6}$ alkyl group, a silylated $C_{1-6}$ alkyl group, an oxy $C_{1-6}$ alkyl group, an oxy silylated $C_{1-6}$ alkyl group, a $C_{6-10}$ aryl group, an oxy $C_{6-10}$ aryl group, a silylated $C_{6-10}$ aryl group, an oxy silylated $C_{6-10}$ aryl group, a $C_{1-10}$ arylalkyl group, an oxy $C_{1-10}$ arylalkyl group, a silylated $C_{1-10}$ arylalkyl group, an oxy silylated $C_{1-10}$ arylalkyl group, a $C_{6-10}$ alkylaryl group, an oxy $C_{6-10}$ alkylaryl group, a silylated $C_{6-10}$ alkylaryl group, an oxy silylated $C_{6-10}$ alkylaryl group; wherein r is selected from the group consisting of 0, 1, 2 and 3; wherein $R^4$ is selected from the group consisting of a $C_{1-3}$ alkyl; wherein x is selected from the group consisting of 0 and 1; wherein $R^5$ is selected from the group consisting of a hydrogen and a methyl group; wherein each $R^6$ is a hydrogen;

wherein the silyl acrylate monomer includes at least one Si atom; wherein the deuterated silyl acrylate monomer is according to the following formula $(R^7(R^8)(R^9)Si)_tR^{10}_yOOCC(R^{11})=CR^{12}_2$ wherein each $R^7$, $R^8$ and $R^9$ is independently selected from a $C_{1-6}$ alkyl group, a silylated $C_{1-6}$ alkyl group, an oxy $C_{1-6}$ alkyl group, an oxy silylated $C_{1-6}$ alkyl group, a $C_{6-10}$ aryl group, an oxy $C_{6-10}$ aryl group, a silylated $C_{6-10}$ aryl group, an oxy silylated $C_{6-10}$ aryl group, a $C_{1-10}$ arylalkyl group, an oxy $C_{1-10}$ arylalkyl group, a silylated $C_{1-10}$ arylalkyl group, an oxy silylated $C_{1-10}$ arylalkyl group, a $C_{6-10}$ alkylaryl group, an oxy $C_{6-10}$ alkylaryl group, a silylated $C_{6-10}$ alkylaryl group, an oxy silylated $C_{6-10}$ alkylaryl group, a deuterated $C_{1-6}$ alkyl group, a deuterated silylated $C_{1-6}$ alkyl group, a deuterated oxy $C_{1-6}$ alkyl group, a deuterated oxy silylated $C_{1-6}$ alkyl group, a deuterated $C_{6-10}$ aryl group, a deuterated oxy $C_{6-10}$ aryl group, a deuterated silylated $C_{6-10}$ aryl group, a deuterated oxy silylated $C_{6-10}$ aryl group, a deuterated $C_{1-10}$ arylalkyl group, a deuterated oxy $C_{1-10}$ arylalkyl group, a deuterated silylated $C_{1-10}$ arylalkyl group, a deuterated oxy silylated $C_{1-10}$ arylalkyl group, a deuterated $C_{6-10}$ alkylaryl group, a deuterated oxy $C_{6-10}$ alkylaryl group, a deuterated silylated $C_{6-10}$ alkylaryl group and a deuterated oxy silylated $C_{6-10}$ alkylaryl group; wherein t is selected from the group consisting of 0, 1, 2 and 3; wherein $R^{10}$ is selected from the group consisting of a $C_{1-3}$ alkyl group, and a deuterated $C_{1-3}$ alkyl; wherein y is 0 or 1; wherein $R^{11}$ is selected from the group consisting of a hydrogen, a deuterium, a methyl group and a deuterated methyl group; wherein each $R^{12}$ is selected from a hydrogen and a deuterium; wherein the deuterated silyl acrylate monomer contains at least one Si atom; and, wherein the deuterated silyl acrylate monomer contains at least one deuterium; wherein the silyl acrylate block modifying monomer is selected from the group consisting of an alkene and a cycloalkene; and, wherein the deuterated silyl acrylate block modifying monomer is selected from the group consisting of a deuterated alkene and a deuterated cycloalkene.

6. The copolymer composition of claim 5, wherein the copolymer composition contains 5 to 30 wt % antioxidant (based on the weight of the block copolymer).

7. The copolymer composition of claim 5,
wherein the acrylate monomer is selected from the group consisting of butyl (meth)acrylate, propyl (meth)acrylate), ethyl (meth)acrylate, methyl (meth)acrylate; wherein the deuterated acrylate monomer is selected from the group consisting of deuterated butyl (meth) acrylate, deuterated propyl (meth)acrylate), deuterated ethyl (meth)acrylate, deuterated methyl (meth)acrylate; wherein the acrylate block modifying monomer is ethylene; and, wherein the deuterated acrylate block modifying monomer is deuterated ethylene; and,
wherein the silyl acrylate monomer is selected from the group consisting of (trimethylsilyl)methyl (meth)acrylate, (triethylsilyl)methyl (meth)acrylate, (tripropylsilyl)methyl (meth)acrylate, (triisopropylsilyl)methyl (meth)acrylate, (tributylsilyl)methyl (meth)acrylate, (tri-sec-butylsilyl)methyl (meth)acrylate, (triisobutylsilyl)methyl (meth)acrylate, (sec-butylmethylsilyl)methyl (meth)acrylate, (sec-butyldimethylsilyl)methyl (meth)acrylate, (dimethylpropylsilyl)methyl (meth) acrylate, (monomethyldipropylsilyl)methyl (meth) acrylate, (methylethylpropylsilyl)methyl (meth)acrylate, bis(trimethylsilyl)methyl (meth)acrylate, tris (trimethylsilyl)methyl (meth)acrylate, (pentamethyldisilyl)methyl (meth)acrylate, tris(trimethylsiloxy)methyl (meth)acrylate, tris(trimethylsiloxy)

propyl (meth)acrylate), (pentamethyldisiloxy)methyl (meth)acrylate, (pentamethyldisiloxy)propyl (meth)acrylate, (trimethoxysilyl)propyl (meth)acrylate and (triethoxysilyl)propyl (meth)acrylate; wherein the deuterated silyl acrylate monomer is selected from the group consisting of deuterated (trimethylsilyl)methyl (meth)acrylate, deuterated (triethylsilyl)methyl (meth)acrylate, deuterated (tripropylsilyl)methyl (meth)acrylate, deuterated (triisopropylsilyl)methyl (meth)acrylate, deuterated (tributylsilyl)methyl (meth)acrylate, deuterated (tri-sec-butylsilyl)methyl (meth)acrylate, deuterated (triisobutylsilyl)methyl (meth)acrylate, deuterated (sec-butylmethylsilyl)methyl (meth)acrylate, deuterated (sec-butyldimethylsilyl)methyl (meth)acrylate, deuterated (dimethylpropylsilyl)methyl (meth)acrylate, deuterated (monomethyldipropylsilyl)methyl (meth)acrylate, deuterated (methylethylpropylsilyl)methyl (meth)acrylate, deuterated bis(trimethylsilyl)methyl (meth)acrylate, deuterated tris(trimethylsilyl)methyl (meth)acrylate, deuterated (pentamethyldisilyl)methyl (meth)acrylate, deuterated tris(trimethylsiloxy) methyl (meth)acrylate, deuterated tris(trimethylsiloxy) propyl (meth)acrylate), deuterated (pentamethyldisiloxy)methyl (meth)acrylate, deuterated (pentamethyldisoloxy)propyl (meth)acrylate, deuterated (trimethoxysilyl)propyl (meth)acrylate and deuterated (triethoxysilyl)propyl (meth)acrylate; wherein silyl acrylate block modifying monomer is ethylene; and, wherein the deuterated silyl acrylate block modifying monomer is selected from a deuterated ethylene.

8. The copolymer composition of claim 7,
wherein the poly(acrylate) block includes >95 wt % of acrylate monomer derived units, wherein the acrylate monomer is methyl (meth)acrylate; and,
wherein the poly(silyl acrylate) block includes >95 wt % of silyl acrylate monomer derived units, wherein the silyl acrylate monomer is (trimethylsilyl)methyl methacrylate.

9. The copolymer composition of claim 8, wherein the copolymer composition contains 5 to 30 wt % antioxidant (based on the weight of the block copolymer).

10. A method comprising:
providing a substrate;
providing a copolymer composition according to claim 1;
applying a film of the copolymer composition to the substrate;
optionally, baking the film;
annealing the film, leaving a pattern of poly(acrylate) domains and poly(silyl acrylate) domains;
treating the annealed film to remove the poly(acrylate) domains from the annealed film and to convert the poly (silyl acrylate) domains in the annealed film to $SiO_x$.

11. A copolymer composition, comprising: a block copolymer having a poly(acrylate) block and a poly(silyl acrylate) block; wherein the block copolymer exhibits a number average molecular weight, $M_N$, of 1 to 1,000 kg/mol; wherein the block copolymer exhibits a polydispersity, PD, of 1 to 2; and, wherein the block copolymer contains ≤75 wt % of a poly (methyl methacrylate)-block-poly((trimethylsilyl)methyl methacrylate) diblock copolymer.

12. The copolymer composition of claim 11, wherein the block copolymer contains <0.001 wt % of a poly(methyl methacrylate)-block-poly((trimethylsilyl)methyl methacrylate) diblock copolymer.

\* \* \* \* \*